United States Patent [19]
Lee

[11] Patent Number: 5,959,322
[45] Date of Patent: Sep. 28, 1999

[54] ISOLATED SOI MEMORY STRUCTURE WITH VERTICALLY FORMED TRANSISTOR AND STORAGE CAPACITOR IN A SUBSTRATE

[75] Inventor: Kyu-Pil Lee, Kyungki-do, Rep. of Korea

[73] Assignee: Samsung Electronics Co., Ltd., Suwon, Rep. of Korea

[21] Appl. No.: 08/299,018

[22] Filed: Aug. 31, 1994

[30] Foreign Application Priority Data

Oct. 7, 1993 [KR] Rep. of Korea ................ 93-20723

[51] Int. Cl.$^6$ ............................. H01C 21/20
[52] U.S. Cl. ................. 257/298; 257/296; 257/300; 257/301; 257/302; 257/303; 257/509; 257/510; 438/296; 438/359; 438/391
[58] Field of Search ........................ 257/296, 298, 257/300, 301, 302, 303, 509, 510; 437/52, 60; 438/296, 359, 391, FOR 212, FOR 223, 244, 253

[56] References Cited

U.S. PATENT DOCUMENTS

| | | | |
|---|---|---|---|
| 4,252,579 | 2/1981 | Ho et al. | 257/302 |
| 4,833,516 | 5/1989 | Hwang . | |
| 5,027,172 | 6/1991 | Jeon | 257/303 |
| 5,055,898 | 10/1991 | Beilstein, Jr. et al. | 257/301 |
| 5,177,576 | 1/1993 | Kimura et al. | 257/302 |
| 5,316,962 | 5/1994 | Matsuo et al. | 437/52 |
| 5,319,235 | 6/1994 | Kihara et al. | 257/510 |
| 5,350,941 | 9/1994 | Madan | 257/510 |
| 5,498,564 | 3/1996 | Geissler et al. | 437/60 |

FOREIGN PATENT DOCUMENTS 361073366 4/1986 Japan ................ 257/302

OTHER PUBLICATIONS

Sunouchi, K. et al., A Surrounding Gate Transistor (SGT) Cell for 64/256Mbit DRAMs, 1989 IEEE, IEDM 89–23–IEDM 89–26.

Nishihara, Toshiyuki et al., A Buried Capacitor DRAM Cell with Bonded SOI for 256M and 1Gbit DRAMs, 1992 IEEE, IEDM 92–803–IEDM 92–806.

Ozaki, T. et al., A Surrounding Isolation–Merged Plate Electrode (SIMPLE) Cell with checkered layout for 256Mbit DRAMs and beyond, 1991 IEEE, IEDM 91–469–IEDM 91–472.

*Primary Examiner*—Fetsum Abraham
*Attorney, Agent, or Firm*—Pillsbury Madison & Sutro LLP

[57] ABSTRACT

A semiconductor device and method for manufacturing the same includes a plurality of memory cells, each cell having a transistor formed on a first semiconductor substrate and comprising first and second impurity regions and a gate electrode, and a compacitor comprising a first electrode connected with the first impurity region of the transistor and a second electrode formed on the first electrode with a dielectric film disposed therebetween, wherein a channel region formed between the first impurity region and the second impurity region of the transistor is vertically located on the capacitor, and a contact hole connecting the second impurity region of the transistor with the bit-line is vertically located on the channel region, thus achieving the cell area required for one-giga-bit memory devices and beyond and enabling increased capacitance.

1 Claim, 14 Drawing Sheets

ISOLATED SOI MEMORY STRUCTURE WITH VERTICALLY FORMED TRANSISTOR AND STORAGE CAPACITOR IN A SUBSTRATE

The present application claims priority from Korean Application No. 20723/93 filed Oct. 7, 1993, the entire disclosure of which is hereby incorporated by reference.

BACKGROUND OF THE INVENTION

The present invention relates to a semiconductor device and a method for manufacturing the same. More particularly, the present invention relates to a semiconductor device which enables increased integration, and a method for manufacturing the same.

Integrating the maximum number of devices in the minimum cell area is important for increasing the integration of a semiconductor memory cell, and particularly, of a dynamic random access memory (DRAM) cell.

In a next-generation 1 Gb DRAM, the memory cell composed of one transistor and one capacitor occupies an area of 0.3 $\mu m^2$ or less. This is the same area as previously needed for just the contact hole for interconnection in a one mega-bit DRAM cell. Forming one transistor, one capacitor, and one contact hole for interconnection all together in such a small area to form a unit cell, is practically impossible with current technology. Particularly, current layout methods have reached a bottleneck in terms of area limitation, so that a novel scheme for achieving the above has become necessary.

In most memory cells now incorporated in chips, a transistor, a capacitor and a contact hole are formed laterally on a planar layout, and the total area thereof acts as a factor in determining the area of the memory cell. Accordingly, since a transistor, a capacitor, and a contact hole for connection of the source and drain regions are formed in an area of 0.3 $\mu m^2$ or less for constituting a giga-bit memory cell, a three-dimensional cell structure is needed to overcome area limitations, and the cell structure must be altered from a lateral layout structure into a vertical layout structure.

While there exists a trench structure or a stacked structure as a typical example of such a three-dimensional cell structure, these structures cannot satisfy a capacitance requirement for next-generation devices.

T. Ozaki el al. suggest a SIMPLE cell wherein the capacitor area can be increased while an isolation region area is minimized (see IEDM '91, "A Surrounding Isolation-merged Plate Electrode (SIMPLE) Cell with Checkered Layout for 256 Mbit DRAMs and Beyond"). However, since the process for connecting the source region of a transistor with a capacitor's storage-node in the SIMPLE cell is a lateral scheme, a contact hole area for connection is needed. Also, a contact hole area for connecting a drain region with a bit-line is needed. Therefore, according to the SIMPLE cell structure, though a design rule of 0.1 $\mu m$ is used, unit DRAM elements cannot be formed within an area of 0.3 $\mu m^2$, and thus, forming the memory cell for giga bit DRAMs and beyond is impossible.

K. Sunouchi et al. suggest a SGT cell wherein all the devices for the unit memory cell are formed in one silicon pillar isolated by a matrix-like trench (see IEDM '89, "A Surrounding Gate Transistor (SGT) cell for 64 and 256 Mbit DRAMs"). However, in the SGT cell, a process for connecting a word-line is added, and the process of forming the silicon pillar and capacitor are complex. Also, the isolation characteristics between the memory cells are poor, and there is a high possibility that a short between a capacitor plate-node and a gate electrode will occur during a process for forming the gate electrode.

Also, U.S. Pat. No. 4,833,516 discloses a memory cell having a transistor and a capacitor of vertical structure. However, such a memory cell has reduced efficiency in terms of cell area utilization.

Further, Toshiyuki Nishihara et al. suggest a silicon-on-insulator (SOI) structure cell wherein a capacitor is completely buried under a silicon layer, so that a memory cell area can be maximized (see IEDM '92, "A Buried Capacitor DRAM Cell with Bonded SOI for 256M and 1 Gbit DRAMs"). However, in the SOI structure cell, it is difficult to control the remaining thickness during the process for polishing a silicon substrate, and a bit-line contact hole area for connecting the drain region of a transistor with a bit-line is needed.

SUMMARY OF THE INVENTION

Accordingly, it is an object of the present invention to provide a semiconductor device which solves the above problems of the conventional method and enables increased integration.

It is another object of the present invention to provide a method especially suited to manufacture the above semiconductor device.

To accomplish the above object, there is provided a semiconductor device including a plurality of memory cells, each cell having a transistor formed on a first semiconductor substrate and comprising first and second impurity regions and a gate electrode, and a capacitor comprising a first electrode connected with the first impurity region of the transistor and a second electrode formed on the first electrode with a dielectric film disposed therebetween, wherein a channel region formed between the first impurity region and the second impurity region of the transistor is vertically located on the capacitor, and a contact hole connecting the second impurity region of the transistor with the bit-line is vertically located on the channel region.

The first electrode of the capacitor is vertically connected with the first impurity region of the transistor. The first electrode, the channel region, and the first and second impurity regions of the transistor are vertically formed on the same semiconductor substrate.

The second electrode of the capacitor is formed as a structure merged with the substrate. The channel region of the transistor is vertically located on the capacitor and is formed on the back side of the first semiconductor substrate.

According to a preferred embodiment of the present invention, the capacitor may be formed as a trench capacitor which is formed by using at least one trench, or may be formed as a cylindrical-type stacked capacitor. Also, the gate electrode of the transistor may be formed as a ring structure surrounding a pillar formed on the back side of the first semiconductor substrate.

To accomplish the second object of the invention, there is provided a method for manufacturing a semiconductor device. The method comprises the steps of: forming a trench isolation region for defining an active region on a first semiconductor substrate; forming a capacitor comprising a first electrode, a dielectric film and a second electrode on the active region of the first semiconductor substrate; etching the back side of the first semiconductor substrate on which the capacitor is formed; selectively etching the back side of the first semiconductor substrate to form a plurality of pillars; and forming a gate electrode of a transistor surrounding the pillars.

A preferred embodiment of the second object of the present invention further comprises a step of attaching a second semiconductor substrate on the second electrode of the capacitor with an insulating layer disposed therebetween, before the step of etching-the back side of the first semiconductor substrate.

A bit-line contact hole for connecting a bit-line to the transistor is simultaneously formed with the gate electrode formation.

According to the present invention, since the capacitor, the channel region of the transistor, and the bit-line contact hole are located vertically with respect to one another, the cell area required for giga-bit memory devices and beyond can be achieved, and the capacitor area can be increased.

BRIEF DESCRIPTION OF THE DRAWINGS

The above objects and advantages of the present invention will become more apparent by the following detailed description of a preferred embodiment thereof with reference to the attached drawings in which:

FIGS. 3, 6, 7, 8, 9, 10, 11 and 12 are cross-sectional views for illustrating a method for manufacturing a semiconductor device according to the first embodiment of the present invention;

DETAILED DESCRIPTION OF THE INVENTION

The present invention will be explained in more detail with reference to the attached drawings.

Figure 1:
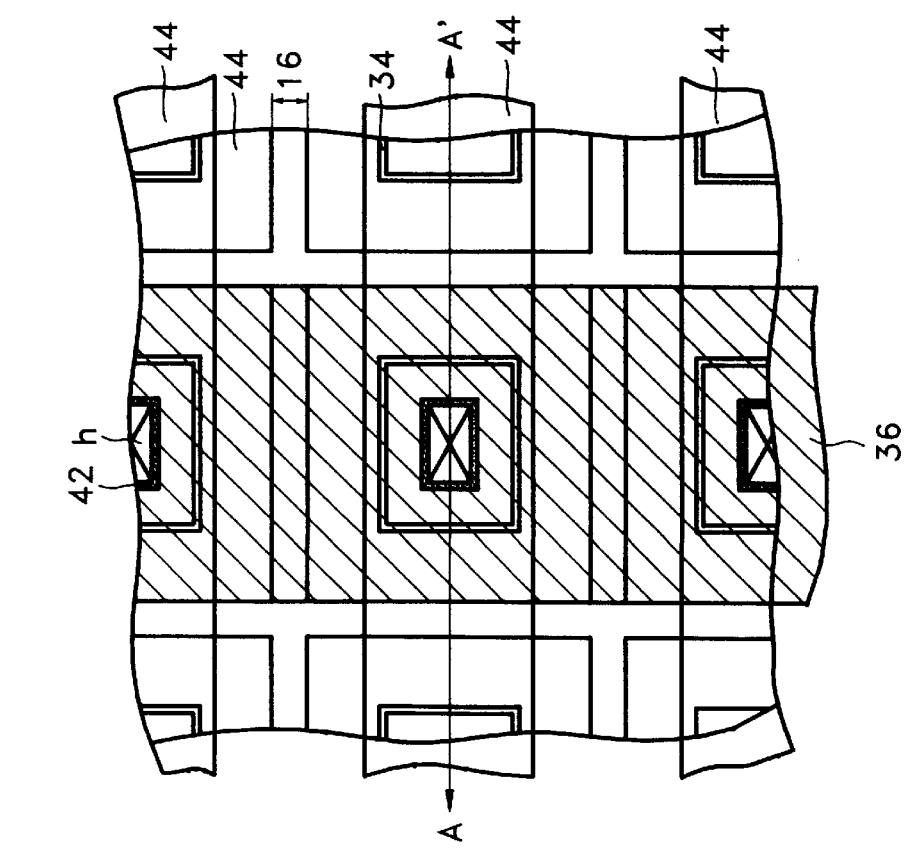
FIG. 1 is a layout diagram of a semiconductor device according to a first embodiment of the present invention.

FIG. 1 is a layout diagram of a semiconductor device according to a first embodiment of the present invention. Here, reference numeral 16 indicates a trench isolation region, 34 indicates a gate insulating film, 36 indicates a gate electrode serving as a word-line, 42 indicates a spacer, 44 indicates a bit-line, and a reference symbol (h) indicates a bit-line contact hole.

As shown in FIG. 1, in the semiconductor device according to the present invention, bit-line contact hole (h) is vertically formed on gate electrode 36 and is surrounded by spacer 42. Also, though not shown in FIG. 1, gate electrode 36 is vertically formed over a capacitor storage-node. Therefore, since the capacitor, transistor and contact hole are vertically stacked in regular sequence, a one-giga-bit cell area of 0.3 $\mu m^2$ or less can be secured by a process where a design rule is about 0.15 $\mu m$ or less.

Figure 2:
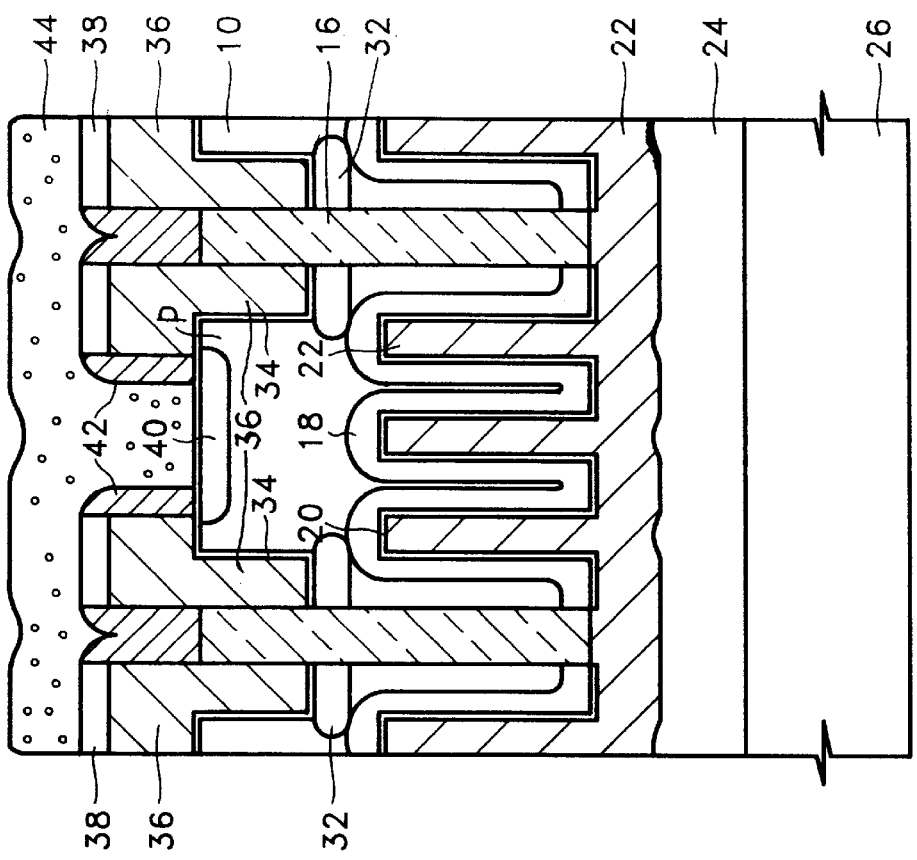
FIG. 2 is a cross-sectional view of a semiconductor device manufactured according to the first embodiment of the present invention, taken along line 2—2 of FIG.1.

FIG. 2 is a cross-sectional view of a semiconductor device manufactured according to the first embodiment of the present invention, taken along line 2—2 of FIG.1, and showing a semiconductor device wherein a first semiconductor substrate 10 has been inverted.

Referring to FIG. 2, a trench capacitor, composed of a plurality of trenches, is formed in an active region of a first semiconductor substrate 10, which active region is defined by at least one trench isolation region 16. In the trench capacitor, the substrate region surrounding an outer wall of the trenches serves as a storage-node 18 and a dielectric film 20 is formed on an inner wall of the trenches, and the interior of the trenches is filled with a plate-node 22. Plate-node 22 extends over trench isolation region 16, so that a unit memory cell is completely surrounded with trench isolation region 16 and plate-node 22.

On plate-node 22 (which indicates a place under plate-node 22 in the drawing), a second semiconductor substrate 26 is attached with an insulating layer 24 disposed therebetween, thereby constituting an SOI structure. Second semiconductor substrate 26 serves as a support of all elements formed on first semiconductor substrate 10.

A plurality of pillars (p) formed by etching first semiconductor substrate 10 are located on the back side thereof wherein the capacitor is formed, and a portion of trench isolation region 16 is exposed between the pillars. A gate electrode 36 of a transistor is formed annularly to thus surround the pillars, with a gate insulating film 34 disposed therebetween. A first impurity region 32 serving as a source region of the transistor is formed on the surface of first semiconductor substrate 10 exposed between the pillars. A second impurity region 40 serving as a drain region is formed on the upper surface of the pillar. First impurity region 32 may be used as the source region of the transistor as described above, or may play the role of reducing a contact resistance between the capacitor storage-node and the source region.

A spacer 42 composed of an insulating material is formed on a sidewall of gate electrode 36. A bit-line 44 is connected with drain region 40 through a bit-line contact hole (h) exposing drain region 40. Spacer 42 insulates gate electrode 36 from bit-line 44.

As shown in FIG. 2, since source region 32, drain region 40, the channel region (not shown) of the transistor, and capacitor storage-node 18 are formed vertically with respect to one another in first semiconductor substrate 10, the design rule margin does not affect the semiconductor device according to the present invention.

FIGS. 3 through 12 are cross-sectional views for illustrating a method for manufacturing a semiconductor device according to the first embodiment of the present invention.

Figure 3:
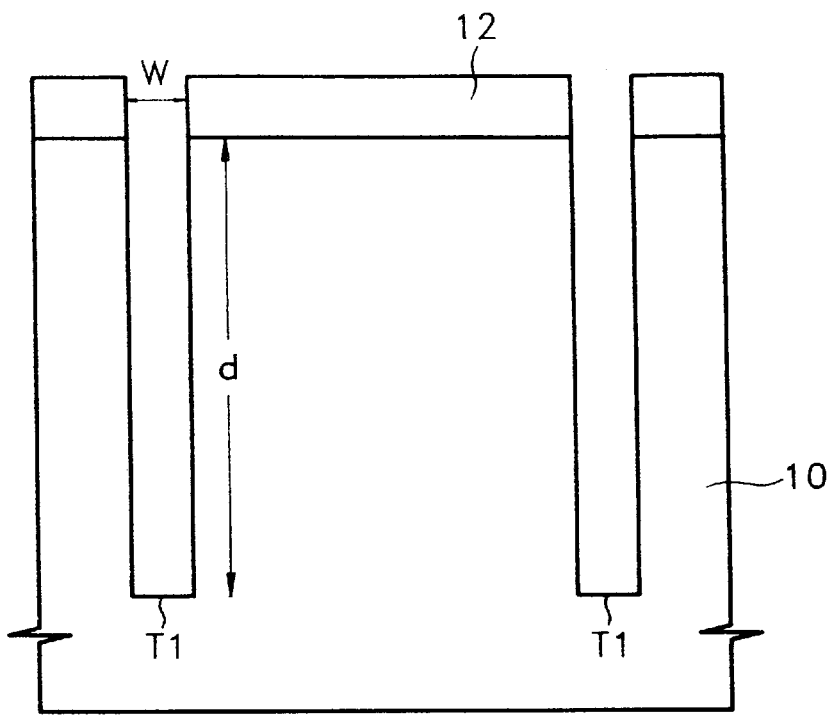

FIG. 3 shows a step of forming a first trench (T1). An insulating material, e.g., a CVD oxide or a high temperature oxide, is deposited to a thickness of 2,000~10,000 Å on a first semiconductor substrate 10 of the P-type, thereby forming a first mask layer 12. Then, first mask layer 12 is patterned by a lithography process, thereby opening a portion where an isolation region will be formed. Thereafter, first semiconductor substrate 10 is etched to a predetermined depth using the patterned first mask layer 12 as an etch-mask, thereby forming first trench (T1). Here, first trench (T1) is formed to a width (w) of 0.1~0.15 μm and to a depth (d) of 1~15 μm. The width (w) and the depth (d) can be changed along with the desired capacitance.

Figure 4A:
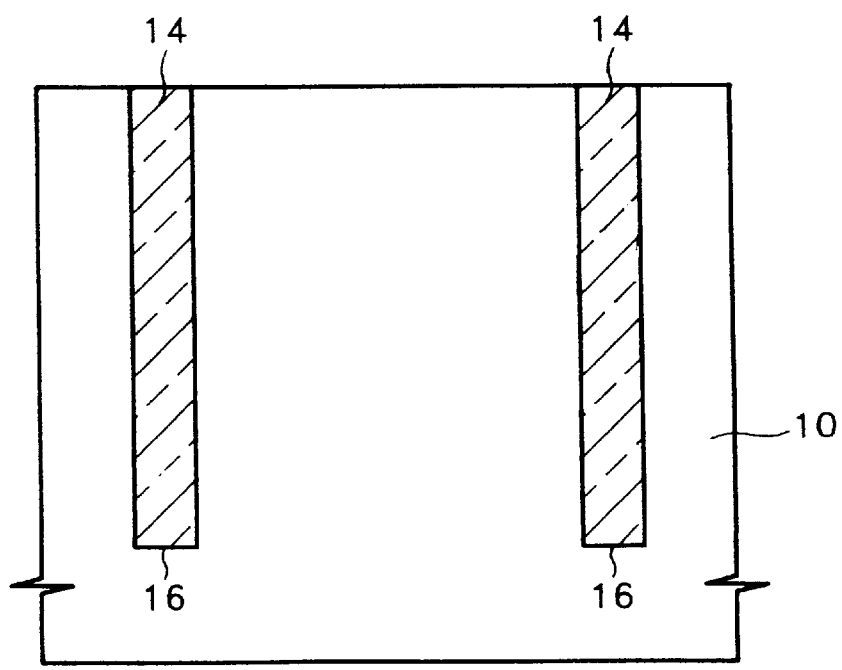
FIG. 4A is a cross-sectional view showing the formation of a trench isolation region.
Figure 4B:
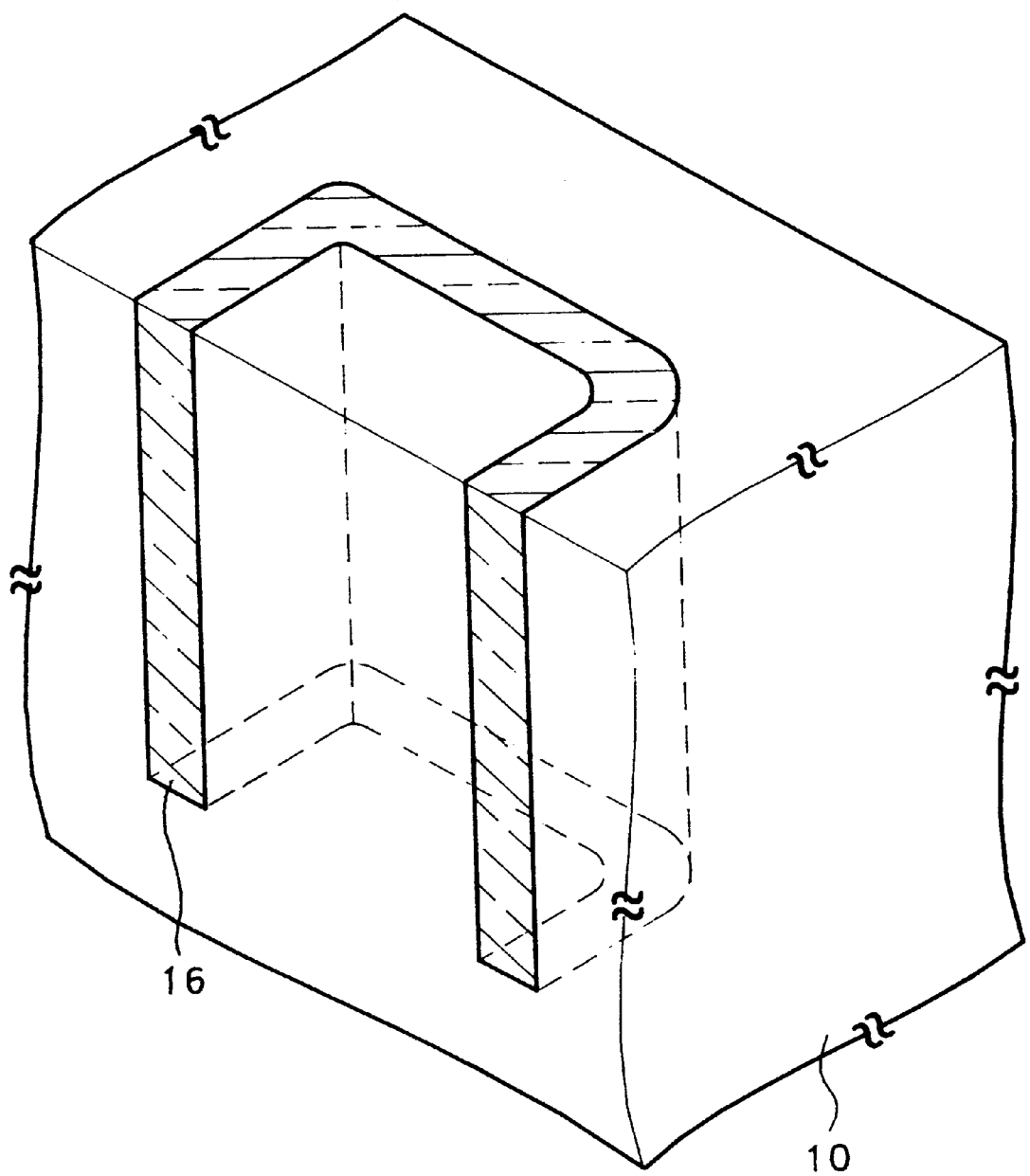
FIG. 4B is a perspective view showing the formation of a trench isolation region.

FIG. 4A shows the step of forming a trench isolation region 16 and FIG. 4B is a perspective view showing the trench isolation region 16. After removing first mask layer 12, an insulating material 14 (e.g., an oxide) is deposited on the entire surface of first semiconductor substrate wherein first trench (T1) is formed. Then, insulating material 14 is etched by an etch-back process or a polishing process, thereby filling the interior of first trench (T1) with insulating material 14. As a result, trench isolation region 16 is formed.

Figure 5A:
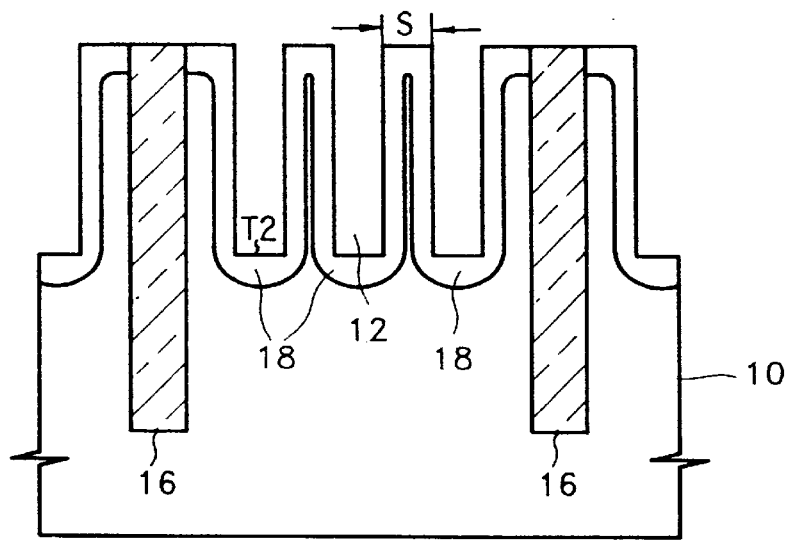
FIG. 5A is a cross-sectional view showing the formation of a second trench and a storage-node.
Figure 5B:
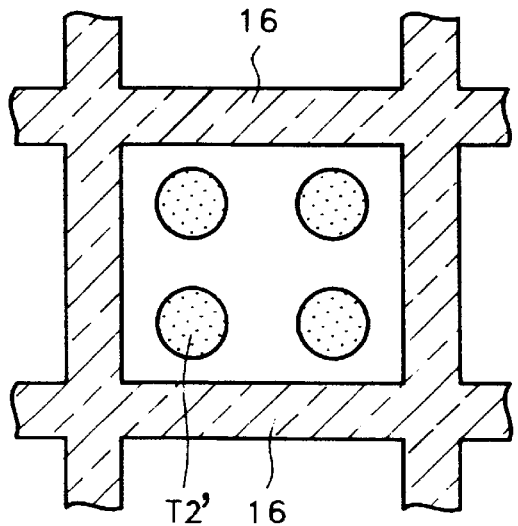
FIGS. 5B and 5C are similar to FIG. 5A, but are plan views showing other second trenches.
Figure 5C:
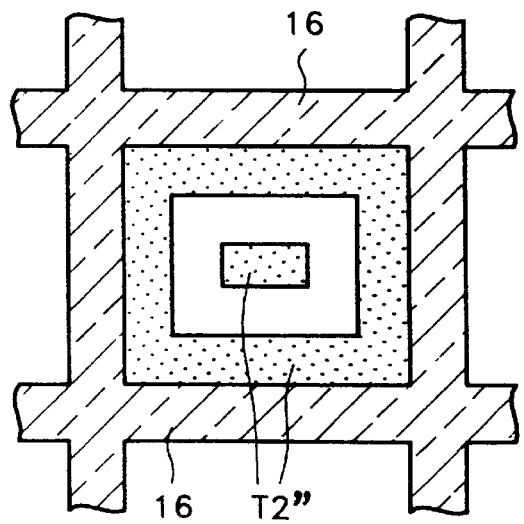

FIG. 5A shows the step of forming a second trench (T2) and a storage-node 18, and FIGS. 5B and 5C are plan views showing additional second trenches (T2', T2") which will be formed according to the capacitance requirement. First semiconductor substrate 10, which is surrounded with trench isolation region 16, is etched to a depth of 0.5~10 μm by a lithography process, thereby forming at least one second trench (T2). At this time, the depth of second trench (T2) can be adjusted in accordance with capacitance and cell area, and the number thereof can be adjusted by the distance (S) between second trenches. Also, as shown in FIGS. 5B and 5C, the shape of second trench can be formed as a structure (T2') having a plurality of rings or a single ring structure (T2"). Then, a portion of the first semiconductor substrate surrounding second trenches (T2) is doped with n type impurities, thereby forming storage-node 18 of the capacitor.

Figure 6:
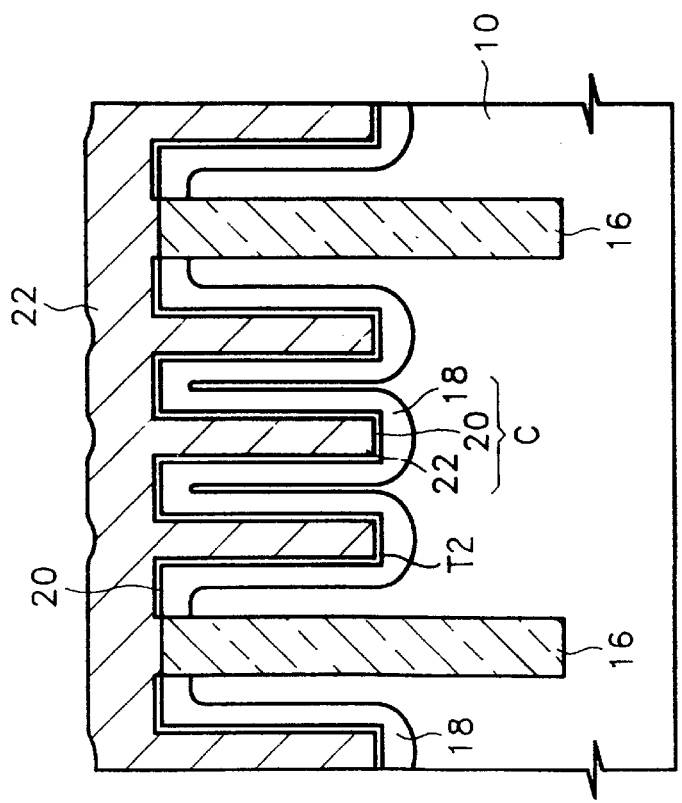

FIG. 6 shows the step of forming a dielectric film 20 and a plate-node 22. A high dielectric material, e.g., $Ta_2O_5$, a PZT compound such as $PbTiO_3$ or $Pb(Zi,Ti)O_3$, or an oxide/nitride/oxide, is deposited on the inner wall of second trench (T2), thereby forming dielectric film 20. Here, before dielectric film 20 is formed, an oxide film may be grown to a thickness of several tens to hundreds of angstroms for cleaning the wall surface of second trench (T2) by a thermal oxidation process and is then stripped, thereby improving the characteristics of dielectric film 20. At this time, without the cleaning by the oxide film, only wet cleaning may be performed. Thereafter, a conductive material is deposited so as to completely fill the interior of second trench (T2) and to have a constant thickness on the basis of trench isolation region 16, thereby forming plate-node 22 of the capacitor. Accordingly, a trench capacitor (C) composed of storage-node 18, dielectric film 20, and plate-node 22 is completed.

Figure 7:
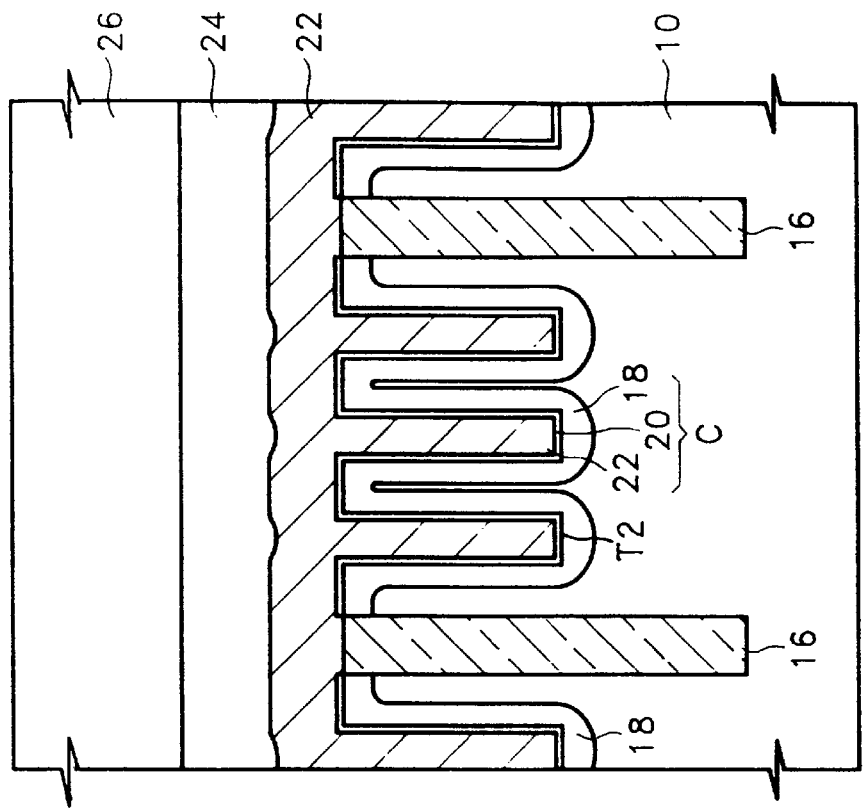

FIG. 7 shows the step of forming an insulating layer 24 and a second semiconductor substrate 26. An insulating material, e.g., $SiO_2$ or BPSG, is deposited to a thickness ranging from thousands of angstroms to tens of micrometers on plate-node 22 of the trench capacitor by chemical vapor deposition (CVD), thereby forming insulating layer 24. Then, the surface of insulating layer 24 is planarized by a polishing or etch-back process. Thereafter, a new wafer is attached on the planarized insulating layer 24 by a general SOI technique, thereby forming second semiconductor substrate 26. Here, second semiconductor substrate 26 serves as a support for all elements formed on first semiconductor substrate 10.

Figure 8:
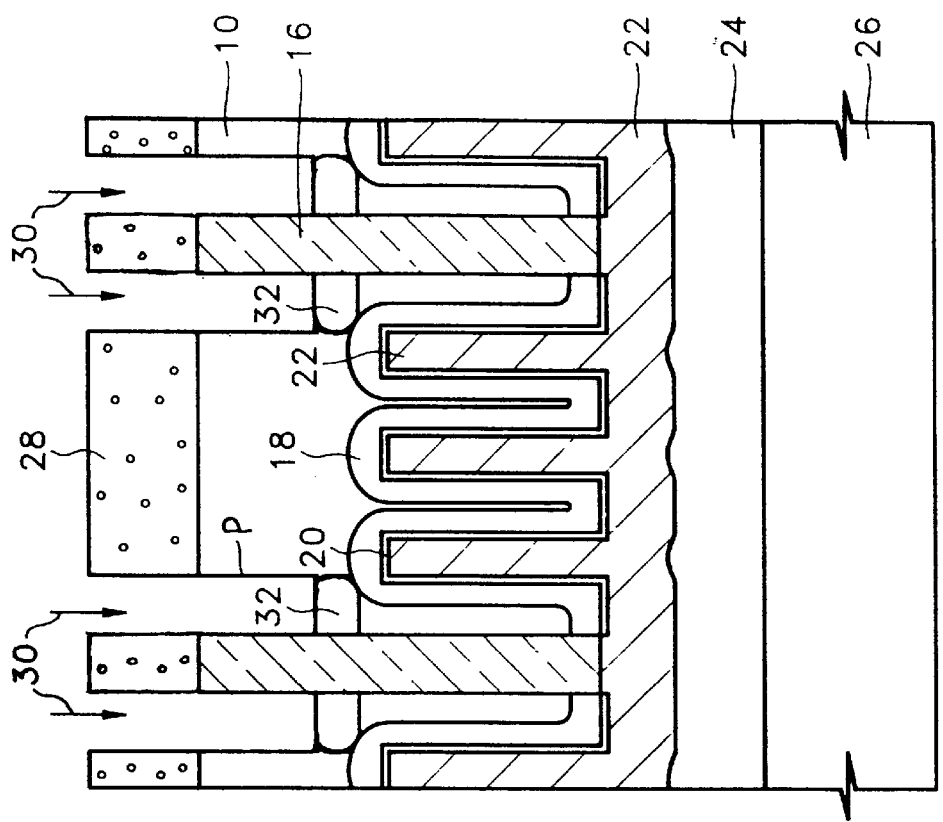

FIG. 8 shows the step of etching the back side of first semiconductor substrate 10. First semiconductor substrate 10 is reversed so as to turn the face thereof (where the trench capacitor is formed) upward. Thereafter, the back side of first semiconductor substrate 10 is etched by a polishing or etch-back process. The above etching process proceeds until trench isolation region 16 is well exposed (see the region indicated by a dotted line in FIG. 8). A SOI structure is completed by the above-described process of FIGS. 7 and 8.

Figure 9:
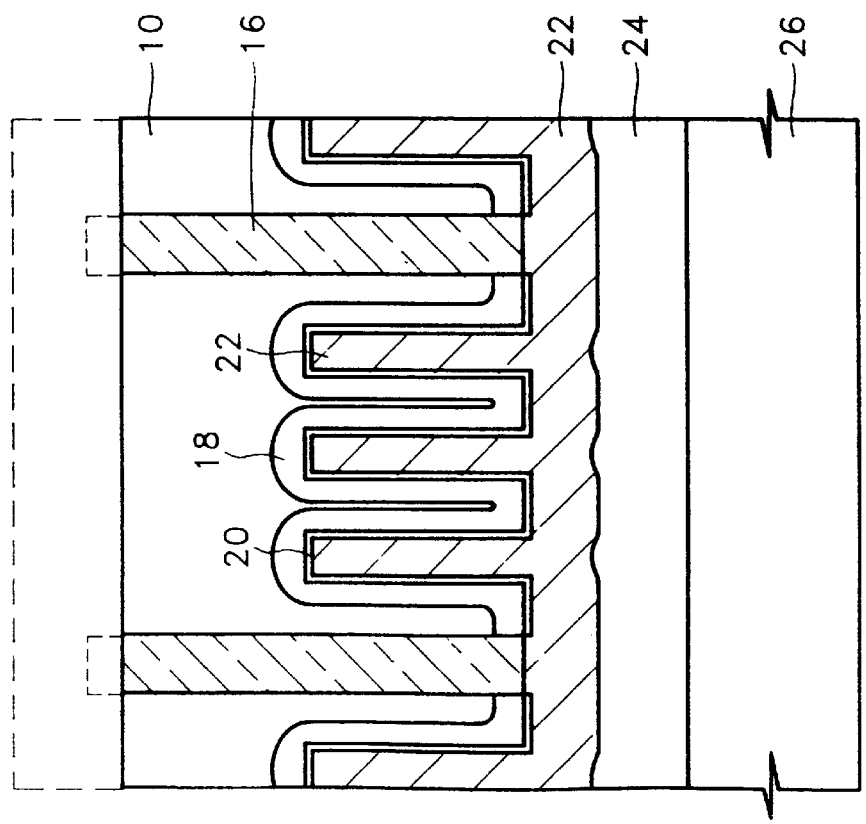

FIG. 9 shows the step of forming a pillar (P) and a first impurity region 32. An insulating material, e.g., a CVD oxide or a high temperature oxide, is deposited on the etched back side of first semiconductor substrate 10, thereby forming a second mask layer 28. Then, second mask layer 28 is patterned by a lithography process, thereby opening a portion excluding trench isolation region 16 and the area where the channel region of a transistor will be formed. Then, the back side of first semiconductor substrate 10 is etched to a depth of 1,000 Å~2 μm, using the patterned second mask layer 28 as an etch-mask, thereby forming a plurality of pillars. Successively, $n^+$ type impurity ions are implanted on the resultant structure, thereby forming an $n^+$ type first impurity region 32 in the surface of first semiconductor substrate 10 which is exposed between pillar (P) and trench isolation region 16. Then, second mask layer 28 is removed. Here, first impurity region 32 is connected with storage-node 19 of the capacitor, so that it serves as a source region of the transistor. Also, when storage-node 18 is sufficiently diffused into the region between the second trenches comprising the capacitor, since the storage-node serves as the source region, first impurity region 32 acts to reduce the contact resistance between the storage-node and the source region. In such a case, the process for forming the first impurity region can be omitted.

Figure 10B:
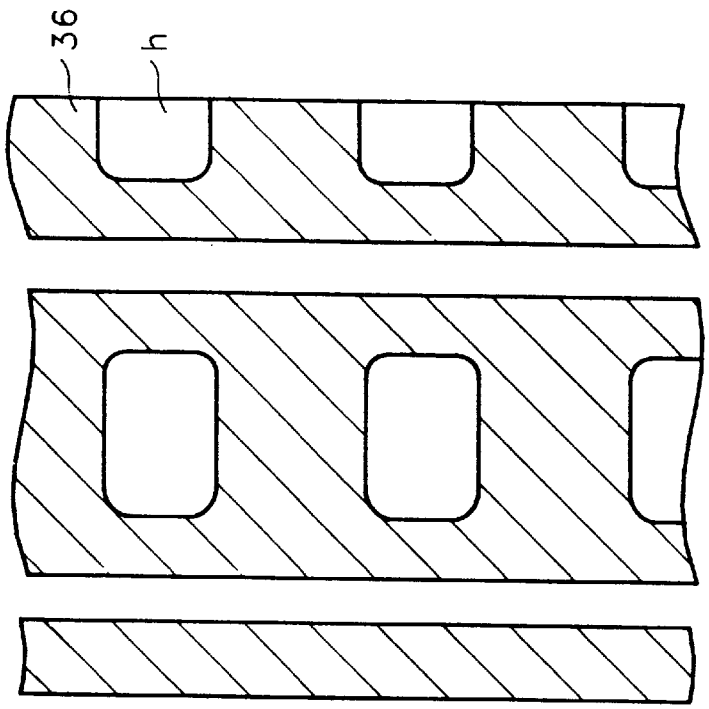
FIG. 10B shows a layout of the gate electrode of FIG. 10A.
Figure 10A:
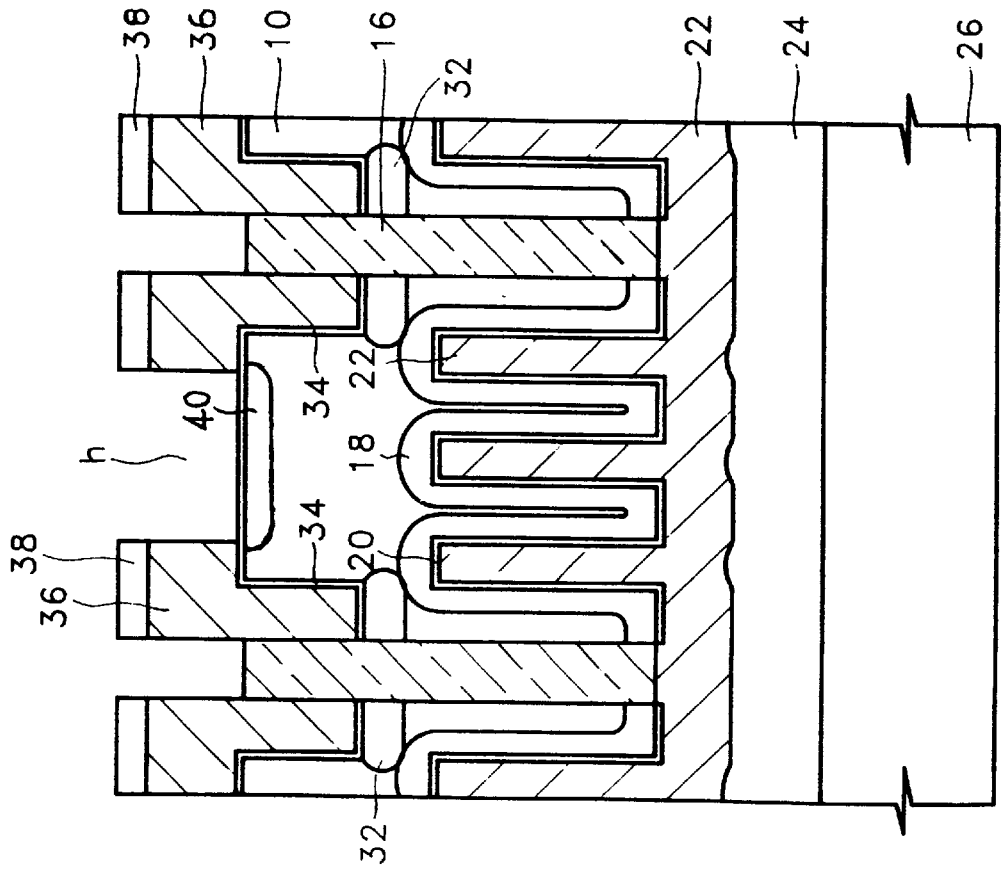
FIG. 10A is a cross-sectional view showing the formation of a gate electrode and a bit-line contact hole.

FIG. 10A shows the step of forming a gate insulating film 34, a gate electrode 36, a second impurity region 40, and a bit-line contact hole (h). FIG. 10B shows the layout of gate electrode 36. After cleaning the surface of pillar (P), an oxide, a high dielectric film, or a composition layer composed of an oxide and a nitride, for example, is formed so that an equivalent oxide thickness is about 30~200 Å on the outer wall of pillar (P), as gate insulating film 34. Thereafter, a conductive material such as an impurity-doped polysilicon and an insulating material such as a CVD oxide are sequentially deposited on the entire surface of the resultant structure wherein gate insulating film 34 is formed, and are patterned by a lithography process, thereby forming an insulating film pattern 38 and a ring-type gate electrode 36 surrounding the pillar. At this time, the top surface of pillar (P) is also opened, so that bit-line contact hole (h) is formed. Then, $n^+$ type impurity ions are implanted on the resultant structure, thereby forming the second impurity region 40, which serves as a drain region of the transistor in the upper surface of pillar (P). Here, since gate electrode 36 is formed so as to surround pillar (P), the channel region is vertically formed along the surface of pillar (P). Therefore, the capacitor, the channel region of the transistor, and the bit-line contact hole are vertically stacked in regular sequence.

Figure 11:
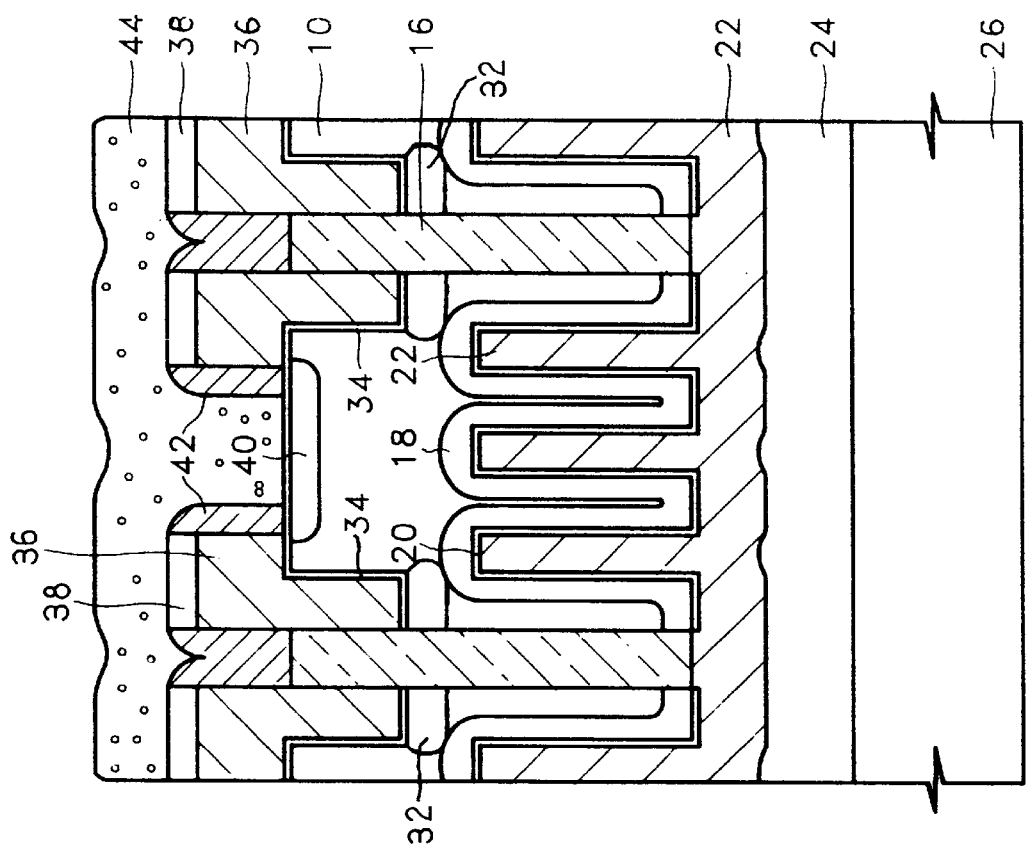

FIG. 11 shows the step of forming a spacer 42. An insulating material is deposited on the entire surface of the resultant structure wherein gate electrode 36 and bit-line contact hole (h) are formed. The insulating material is then anisotropically etched, thereby forming spacer 42 on the sidewall of gate electrode 36. Spacer 42 insulates gate electrode 36 from a bit-line which will be formed in a subsequent process. After forming spacer 42, a high concentration of $n^+$ type impurity ions may be additionally implanted on the resultant structure to thereby dope the upper surface of the pillar so that the resistance of bit-line contact may be reduced.

Figure 12:
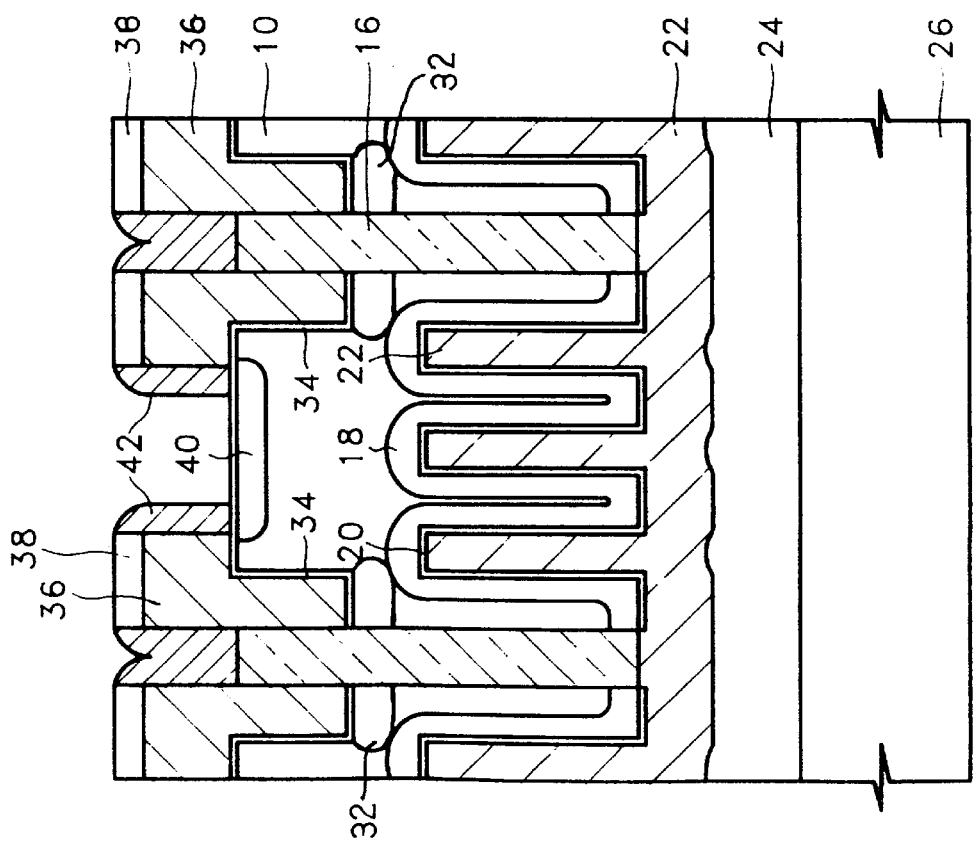

FIG. 12 shows the step of forming a bit-line 44. A conductive material is deposited on the entire surface of the resultant structure wherein spacer 42 is formed. The conductive material is then patterned by a lithography process to thereby form bit-line 44, which is connected with second impurity region 40 serving as the drain region of the transistor through the bit-line contact hole.

According to the above-described first embodiment of the present invention, since the gate electrode and the bit-line contact hole are simultaneously formed, the mask process for forming the bit-line contact hole is omitted. Also, since the unit memory cell composed of the capacitor and the transistor is completely surrounded with the trench isolation region and the capacitor plate-node, the noise current which is generated from the substrate can be shielded so that reliability of the device can be improved. Moreover, since the capacitor can be formed as a trench capacitor composed of a plurality of trenches or a trench of varying depth, the capacitance can be easily increased.

Figure 13:
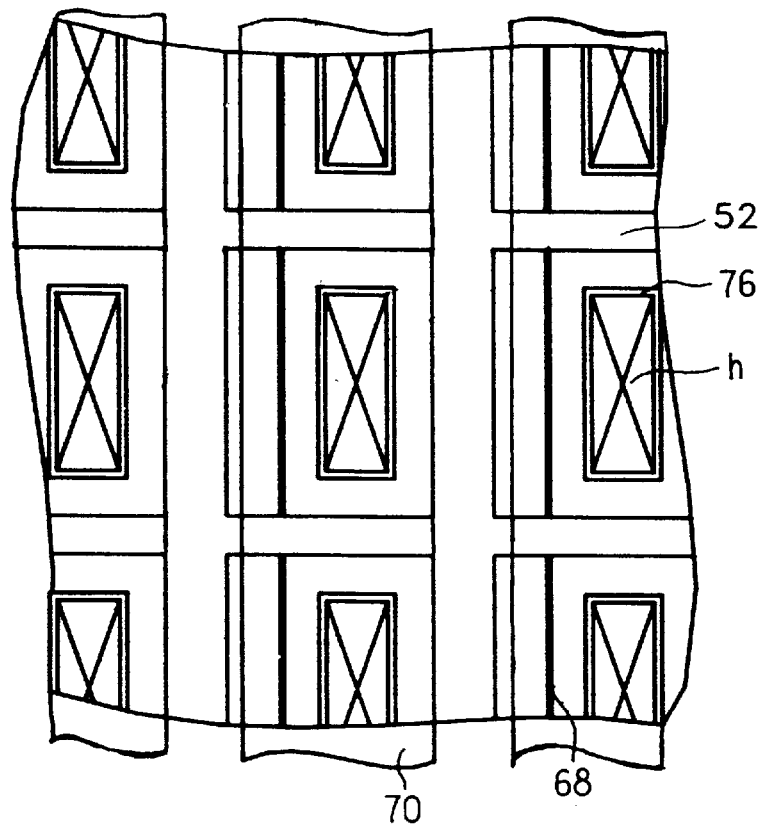
FIG. 13 is a layout diagram of a semiconductor device according to a second embodiment of the present invention.

FIG. 13 is a layout diagram of a semiconductor device according to a second embodiment of the present invention. Here, reference numeral 52 indicates a trench isolation region, 68 indicates a gate insulating film, 70 indicates a gate electrode serving as a word-line, 76 indicates a spacer on the wall of a bit-line contact hole, and reference symbol h indicates a bit-line contact hole.

Comparing the layout diagram of the semiconductor substrate of FIG. 13 with that of FIG.1, it can be seen that gate electrode 36 (FIG.1) is formed as a structure surrounding the pillar completely, while gate electrode 70 (FIG. 13) is formed as a structure where only a portion thereof surrounds the pillar.

FIGS. 14 through 20 are cross-sectional views illustrating a method for manufacturing a semiconductor device according to a third embodiment of the present invention.

Figure 14:
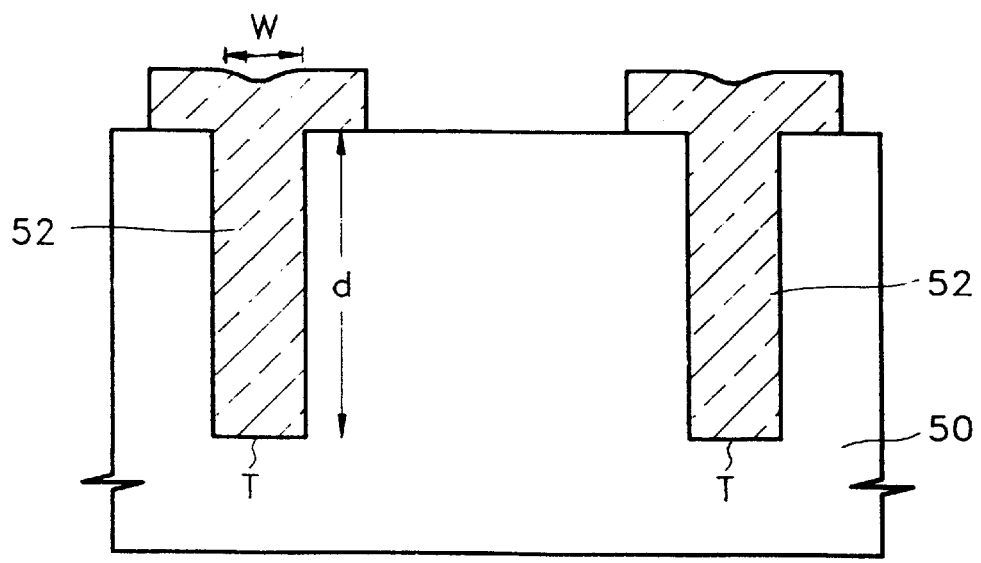
FIGS. 14, 15, 16, 17, 18, 19 and 20 are cross-sectional views illustrating a method for manufacturing a semiconductor device according to a third embodiment of the present invention.

FIG. 14 shows a step of forming a trench isolation region 52. A trench (T) is formed in a first semiconductor substrate 50 of the P-type, by the method described with reference to FIG. 3. Trench (T) is formed to a width (w) of 0.1~0.15 $\mu$m and to a depth (d) of 3,000 Å~1.5 $\mu$m. The depth (d) is determined by a channel length of a transistor. Thereafter, an insulating material is deposited so as to completely fill the interior of trench (T) and to have a constant thickness on the basis of first semiconductor substrate 50. Then, the insulating material is patterned by a lithography process, thereby forming trench isolation region 52. Here, the insulating material filling the interior of trench (T) is patterned so as to be extended to a predetermined portion over first semiconductor substrate 50 which is adjacent to the trench.

Figure 15:
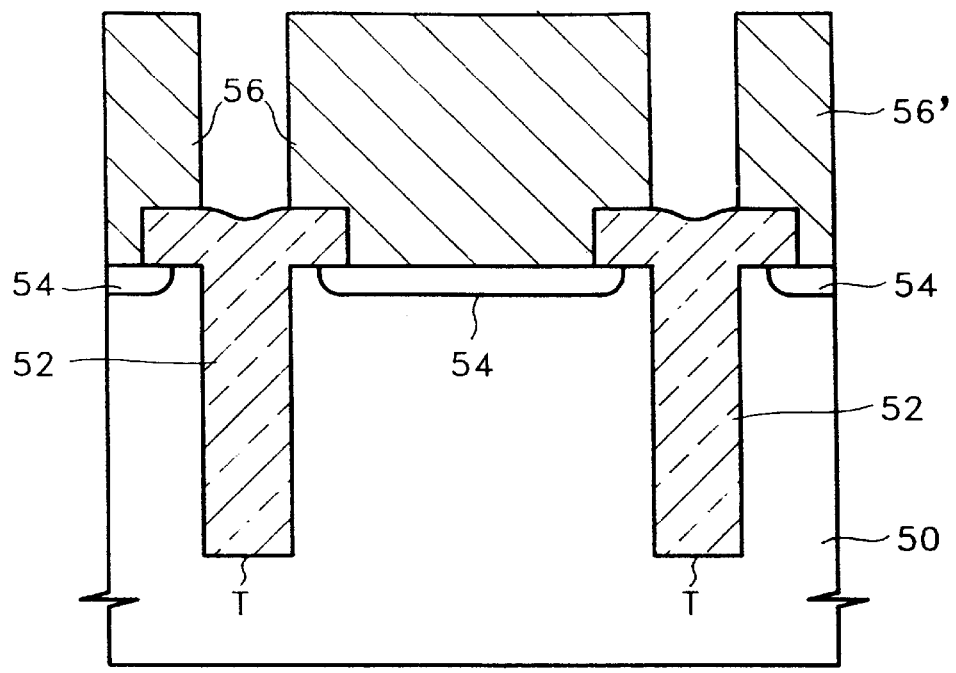

FIG. 15 shows a step of forming an impurity region 54 and a conductive layer pattern 56'. First, n$^+$ type impurity ions are implanted on the entire surface of the first semiconductor substrate 50 wherein trench isolation region 52 is formed. The impurity ions form impurity region 54 for reducing the contact resistance between a capacitor storage-node and a transistor source region which will be formed in a subsequent process. Here, impurity region 54 may be formed by performing an ion-implantation on the entire surface of first semiconductor substrate 50, before the step of patterning the insulating material in FIG. 14.

Thereafter, a conductive material, e.g., an n$^+$ type doped polysilicon, is deposited on the entire surface of first semiconductor substrate 50 and patterned by a lithography process, thereby forming conductive layer pattern 56'.

Figure 16:
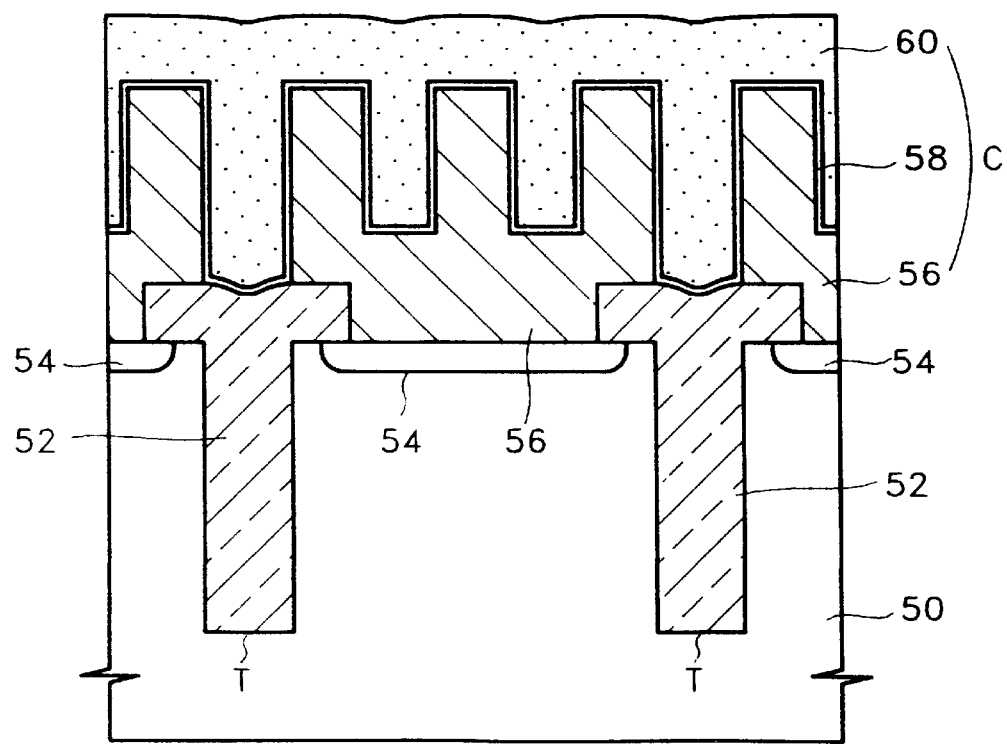

FIG. 16 shows a step of forming a cylindrical-type stacked capacitor (C). Conductive layer pattern 56' is patterned by the method for forming a general cylindrical storage-node, thereby forming a plurality of cylindrical storage-nodes 56. The storage-node may be formed as a structure having a single cylindrical electrode or a structure having a plurality of cylindrical electrodes. Also, the storage-node may be formed as a simple box structure. Then, after forming a dielectric film 58 by depositing a high dielectric material on the entire surface of the cylindrical storage-node 56, a conductive material is deposited on dielectric film 58, thereby forming a plate-node 60. As a result, a cylindrical-type stacked capacitor (C) composed of storage-node 56, dielectric film 58, and plate-node 60 is completed.

Figure 17:
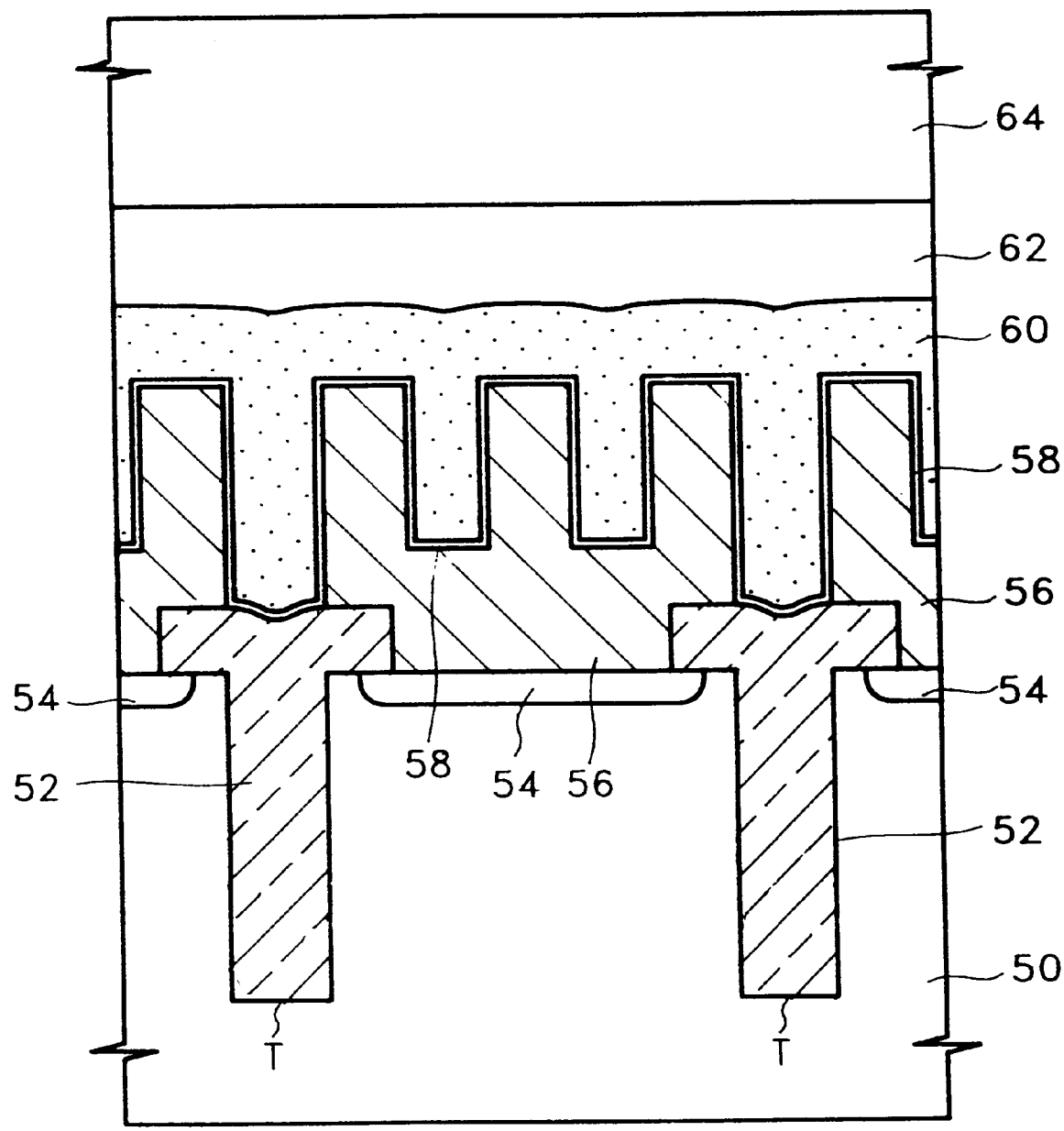

FIG. 17 shows the step of forming an insulating layer 62 and a second semiconductor substrate 64. After forming an insulating layer 62 on plate-node 60 of the cylindrical capacitor, by the method described with reference to FIG. 7, the surface of insulating layer 62 is planarized. Thereafter, a new wafer is attached on the planarized insulating layer 62 by a general SOI technique, thereby forming second semiconductor substrate 64.

Figure 18:
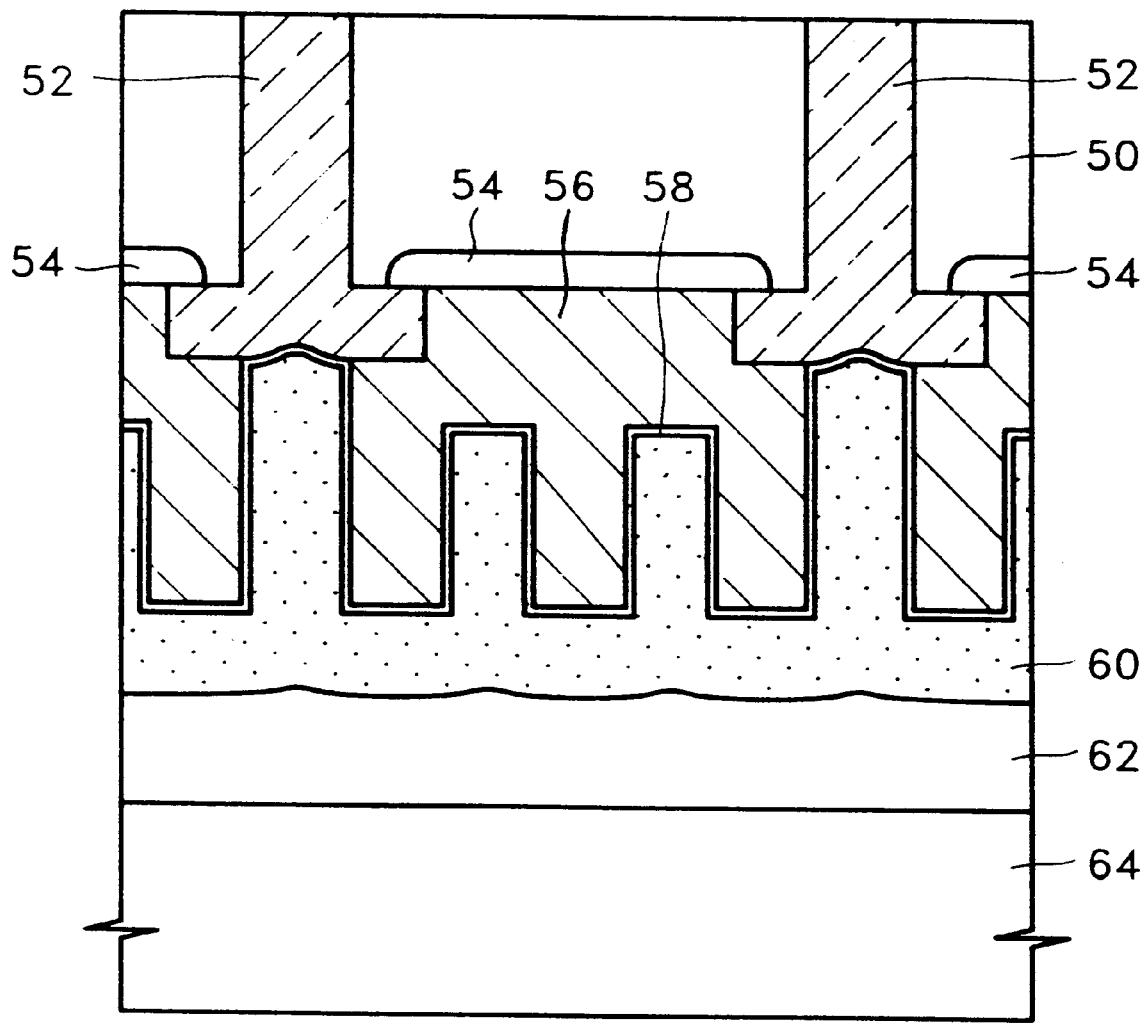

FIG. 18 shows the step of etching the back side of first semiconductor substrate 50. The back side of first semiconductor substrate 50 is etched by the method described with reference to FIG. 8, until trench isolation region 52 is exposed.

Figure 19:
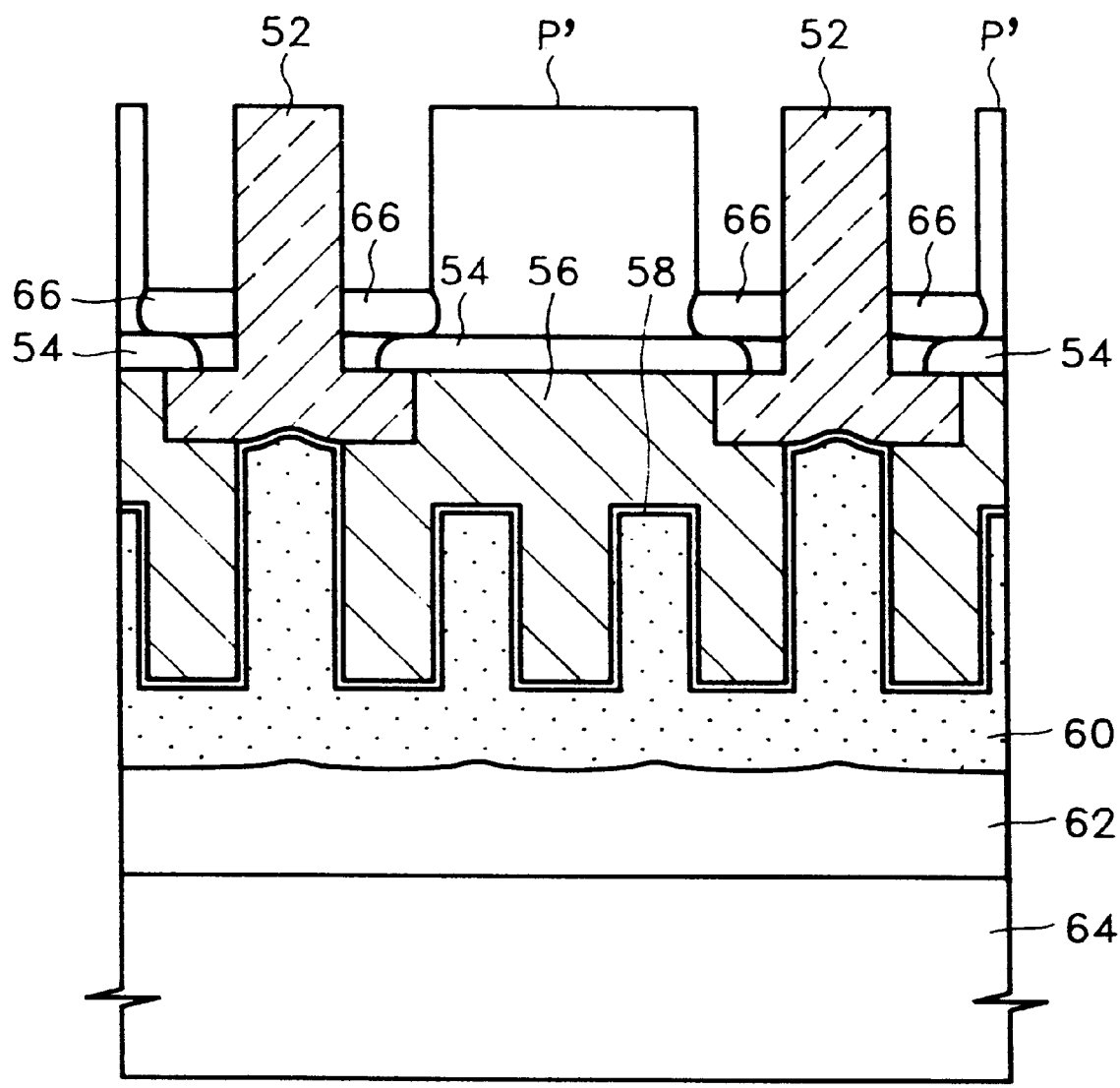

FIG. 19 shows the step of forming a pillar (P') and a first impurity region 66. The back side of first semiconductor substrate 50 is etched to a predetermined depth by the method described with reference to FIG. 9, thereby forming a plurality of pillars (P'). Then, first impurity region 66 serving as a source region of a transistor is formed in the exposed first semiconductor substrate 50 between pillars (P').

Figure 20:
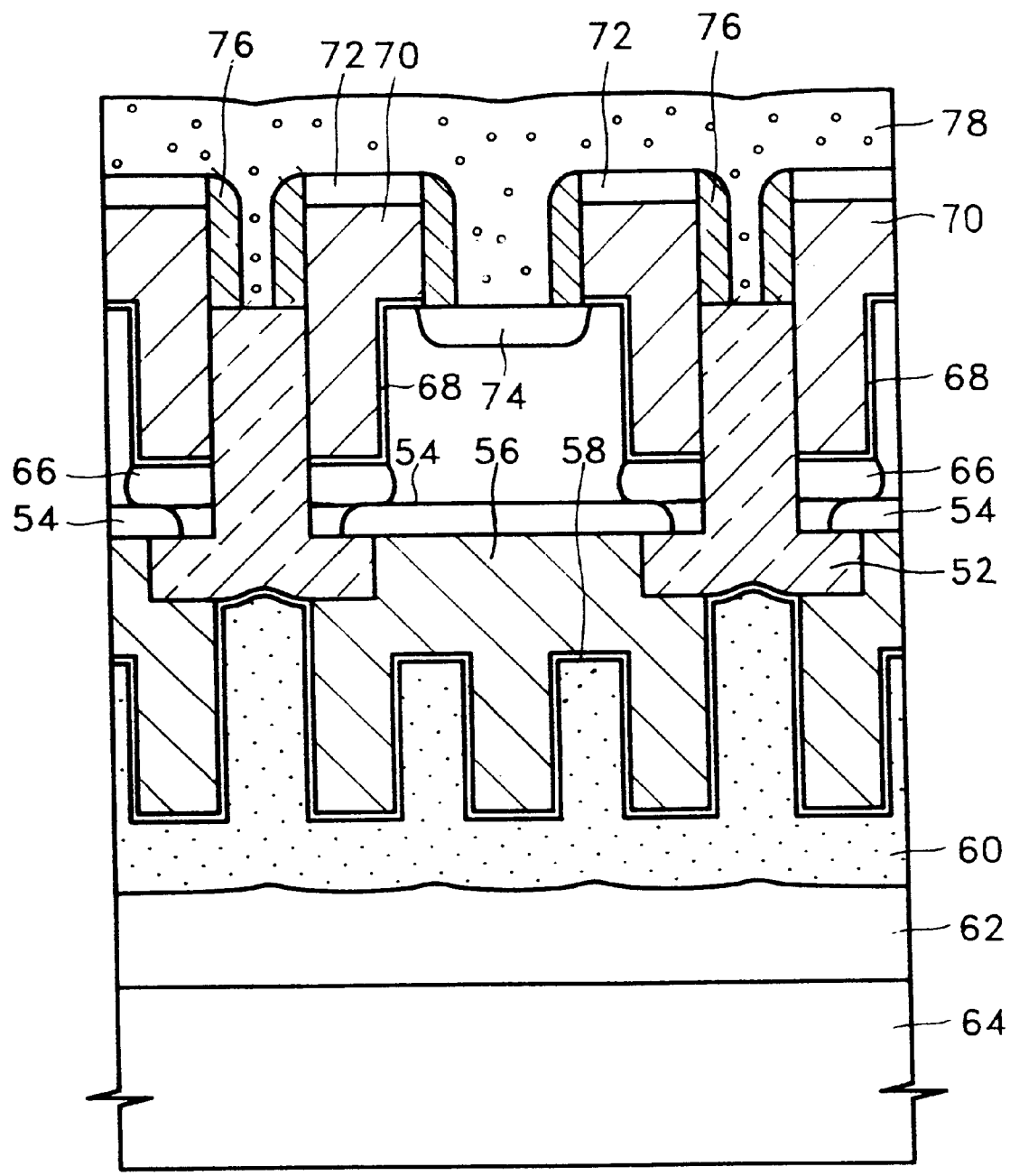

FIG. 20 shows the step of forming a gate electrode 70, a second impurity region 74, a spacer 76, and a bit-line 78. After forming a gate insulating film to a thickness of 30~200 Å on the outer wall of pillar (P'), by the method described with reference to FIG. 10A, a conductive material such as an impurity-doped polysilicon, silicide or metal conductor and an insulating material are sequentially deposited and patterned by a lithography process, thereby forming an insulating film pattern 72 and a ring-type gate electrode 70 surrounding the pillar (P'). At this time, the top surface of pillar (P') is also opened, so that a bit-line contact hole (not shown) is formed. Then, n$^+$ type impurity ions are implanted on the resultant structure, thereby forming second impurity region 74 serving as a drain region of the transistor in the upper surface of pillar (P'). Then, spacer 76 is formed on the sidewall of gate electrode 70 by the method described with reference to FIG. 11. Thereafter, a conductive material is deposited on the resultant structure wherein spacer 76 is formed. The conductive material is patterned by a lithography process, thereby forming bit-line 78 which is connected with second impurity region 74 through the bit-line contact hole. Here, before bit-line 78 is formed, a high concentration of n$^+$ type impurity ions may be additionally implanted on the resultant structure to thereby dope the upper surface of the pillar so that the resistance of the bit-line contact may be reduced.

According to the above-described third embodiment of the present invention, since the cylindrical capacitor is formed on the first semiconductor substrate, the depth of the trench isolation region can be formed shallower than that in the first embodiment. When the narrow and deep trench isolation region is formed as in the first embodiment, and the back side of the first semiconductor substrate is etched, detecting an etching-end point may be difficult due to poor depth uniformity of the trench isolation region. In the above-described third embodiment, since a shallow trench isolation region is formed, the depth uniformity is improved, so that the back side of the first semiconductor substrate can be precisely etched.

According to the present invention as described above, since the capacitor, the channel region of the transistor, and the bit-line contact hole are disposed vertically with respect to one another, the cell area required for one-giga-bit memory cells and beyond can be achieved, while the capacitor area can be easily increased. Also, the unit memory cell is completely isolated by the adjacent memory cell and the trench isolation region, so that the soft-error rate and refresh characteristics are improved. Moreover, since the bit-line contact hole is simultaneously formed with the gate electrode formation, increased process margin and process simplification can be realized.

It will be understood by those skilled in the art from the foregoing description of a preferred embodiment of the disclosed device that various changes and modifications may be made in the invention without departing from the spirit and scope thereof.

What is claimed is:

1. A semiconductor device including a plurality of memory cells, each cell having:

i) a transistor formed on a first semiconductor substrate and comprising first and second impurity regions, a channel region formed between said first and second impurity regions, and a gate electrode, ii) a capacitor comprising a first electrode connected with said first impurity region of said transistor, a second electrode, and a dielectric film disposed between said electrodes, said capacitor being a stacked capacitor, and iii) a contact hole connecting said second impurity region of said transistor with a bit-line, said transistor, said capacitor, and said contact hole of each cell being formed such that at least said channel region of said transistor, said contact hole, and said first electrode of said capacitor are all vertically disposed with respect to one another, said first electrode of said capacitor and said first impurity region of said transistor being connected by a third impurity region disposed between said first electrode and said first impurity region.

* * * * *